(12) United States Patent
Kusuda (10) Patent No.: US 7,935,913 B2
(45) Date of Patent: May 3, 2011

(54) APPARATUS AND METHOD FOR THERMAL PROCESSING OF SUBSTRATE

(75) Inventor: Tatsufumi Kusuda, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 877 days.

(21) Appl. No.: 10/940,095

(22) Filed: Sep. 14, 2004

(65) Prior Publication Data

US 2005/0063448 A1 Mar. 24, 2005

(30) Foreign Application Priority Data

Sep. 18, 2003 (JP) ................................. 2003-325636

(51) Int. Cl.
*H05B 1/02* (2006.01)
*G01J 5/08* (2006.01)
*G01J 5/10* (2006.01)

(52) U.S. Cl. ........ 219/411; 219/413; 219/502; 392/416; 374/131

(58) Field of Classification Search ........................ None
See application file for complete search history.

(56) References Cited

U.S. PATENT DOCUMENTS

| 4,571,486 | A | | 2/1986 | Arai et al. ...................... 219/354 |
| 4,649,261 | A | | 3/1987 | Sheets ............................ 219/390 |
| 5,001,327 | A | * | 3/1991 | Hirasawa et al. ............. 219/390 |
| 5,705,224 | A | | 1/1998 | Murota et al. |
| 5,743,643 | A | * | 4/1998 | Gronet et al. ................. 374/121 |
| 6,191,397 | B1 | * | 2/2001 | Hayasaki et al. ............. 118/725 |
| 6,375,348 | B1 | * | 4/2002 | Hebb et al. ........................ 374/9 |
| 6,417,515 | B1 | * | 7/2002 | Barrett et al. ............ 250/492.21 |
| 6,530,687 | B1 | * | 3/2003 | Suzuki et al. ................. 374/131 |
| 6,603,101 | B2 | * | 8/2003 | Hayasaki et al. ............. 118/725 |
| 6,726,356 | B2 | | 4/2004 | Tanaka et al. ................... 374/31 |
| 6,839,507 | B2 | * | 1/2005 | Adams et al. .................. 392/416 |
| 7,041,931 | B2 | * | 5/2006 | Jennings et al. ............. 118/50.1 |
| 7,041,939 | B2 | * | 5/2006 | Hosokawa .................... 118/50.1 |
| 2001/0006530 | A1 | * | 7/2001 | Adams et al. ................. 374/131 |

(Continued)

FOREIGN PATENT DOCUMENTS

JP         57-162340         10/1982

(Continued)

OTHER PUBLICATIONS

Japanese Office Action issued Jan. 30, 2008.

(Continued)

*Primary Examiner* — Joseph M Pelham
(74) *Attorney, Agent, or Firm* — Ostrolenk Faber LLP (57) ABSTRACT

A thermal processing apparatus (1) comprises a chamber body (6), a holding part (7) for holding a substrate (9) inside the chamber body (6), a light emitting part (5) for heating the substrate (9) through light irradiation and a light measuring part (2) for measuring light energy. The light measuring part (2) comprises a calorimeter (24) disposed outside the chamber body (6), a light guide structure (20) for guiding the light inside the chamber body (6) to the calorimeter (24) and a calculation part (25) for performing computations on the basis of an output of the calorimeter (24). In the thermal processing apparatus (1), by measuring the light from the light emitting part (5) by the calorimeter (24), it is possible to measure the energy of light emitted from the light emitting part (5) during thermal processing inside chamber body (6) and obtain a surface temperature of the substrate (9) by the calculation part (25).

3 Claims, 10 Drawing Sheets

U.S. PATENT DOCUMENTS

| | | | |
|---|---|---|---|
| 2001/0010308 A1* | 8/2001 | Hauf et al. | 219/411 |
| 2002/0139790 A1* | 10/2002 | Adams et al. | 219/411 |
| 2002/0141477 A1* | 10/2002 | Akahori et al. | 374/126 |
| 2004/0013418 A1* | 1/2004 | Kusuda et al. | 392/407 |
| 2004/0149715 A1* | 8/2004 | Timans et al. | 219/390 |
| 2005/0236395 A1* | 10/2005 | Timans et al. | 219/497 |

FOREIGN PATENT DOCUMENTS

| | | |
|---|---|---|
| JP | 59-169125 | 9/1984 |
| JP | 60-258928 | 12/1985 |
| JP | 62-15817 | 1/1987 |
| JP | 62-105419 | 5/1987 |
| JP | 3-145123 | 6/1991 |
| JP | 3-197680 | 8/1991 |
| JP | 4-291916 | 10/1992 |
| JP | 5-025644 | 2/1993 |
| JP | 63-166219 | 7/1998 |
| JP | 10-233370 | 9/1998 |
| JP | 11-135449 | 5/1999 |
| JP | 2002-357660 | 12/2002 |

OTHER PUBLICATIONS

Office Action issued Oct. 28, 2009 by Japanese Patent Office in connection with counterpart Japanese Patent Application No. 2003-325636 (JP62-105419 and JP3-197680 were previously submitted with an Information Disclosure Statement filed on Feb. 7, 2008 and are therefore not enclosed.).

* cited by examiner

APPARATUS AND METHOD FOR THERMAL PROCESSING OF SUBSTRATE

BACKGROUND OF THE INVENTION

1. Field of the Invention

The present invention relates to a technique for performing a processing accompanied with heating on a substrate.

2. Description of the Background Art

Conventionally, in various stages of a process for manufacturing a semiconductor substrate, a glass substrate for a display device or the like (hereinafter, referred to simply as "a substrate"), a thermal processing is performed for the substrate, and a rapid thermal process (hereinafter, referred to as "RTP") is used as a method of thermal processing. In the RTP, by heating the substrate in a chamber with halogen lamps or the like to raise the temperature thereof up to a predetermined temperature in a short time, it is possible to perform processings which have been hard to execute by a conventional long thermal processing with an electric furnace, such as thinning of an insulating film such as an oxide film, suppressing of rediffusion of impurities (or dopants) which are implanted by ion implantation in an activation process, or the like.

In such a thermal processing apparatus as used for the above processing, in order to suppress nonuniformity of the processing on the substrate, proposed is a technique to ensure uniformity of temperature distribution in the substrate during the thermal processing. Another technique is also proposed, which is intended to prevent any processing failure on the substrate by detecting deterioration due to time variation of a plurality of lamps or the like. Japanese Patent Application Laid Open Gazette No. 11-135449, for example, discloses a technique to ensure uniformity of heat distribution in the substrate while early detecting deterioration of lamps by providing a plurality of lamps which are individually controlled in a light emitting part having a multilayer mirror structure consisting of hemispherical reflection mirrors of various sizes and providing photosensors for monitoring the amount of outgoing lights from each of the lamps between each pair of adjacent reflection mirrors.

Japanese Patent Application Laid Open Gazette No. 2002-357660 discloses a calorimeter for converting light energy absorbed by a black body in a sensor into an electrical signal which has a property of fast response, thereby responding a short radiation pulse.

In the thermal processing apparatus using lamps, there is a possibility of reducing light energy which would reach a surface of the substrate due to deterioration of the lamps, stains and dirt on windows of a chamber through which light enters or the like. Especially, in recent, also proposed is a technique to heat the substrate in a shorter time by using flash lamps as a heat source for the substrate and in a thermal processing apparatus using flash lamps, there may be a case where organic substances or the like floating in the air are carbonated by a flash of the flash lamps to be deposited onto surfaces of the windows in the chamber.

The reduction in light energy going into the chamber due to the stains and dirt on the windows of the chamber can not be grasped by monitoring the energy of light going out from the lamps near the lamps. Since the irradiation time of the flash lamps is extremely short and it is therefore impossible to measure the light energy with high accuracy by a method of using a generally-used photosensor, a method of monitoring infrared rays passing through the substrate, a method of calculating the spectral distribution on a surface of the substrate or the like, it is hard to detect deterioration and a breakdown of the flash lamps due to time variation or the like. In a case where a processing for a substrate is performed with the energy of light emitted into the chamber lowered, there arises a possibility of causing a failure in the processing for a substrate.

On the other hand, in the thermal processing apparatus using the flash lamps, since heating for a substrate is performed in an extremely short time, it is disadvantageously difficult to measure a surface temperature of a substrate during thermal processing in real time.

SUMMARY OF THE INVENTION

It is an object of the present invention to measure energy of light in a chamber, which is emitted to a substrate during thermal processing. It is another object of the present invention to calculate a surface temperature of a substrate during thermal processing.

The present invention is intended for an apparatus for performing a processing accompanied with heating through irradiating a substrate with light. The apparatus comprises a chamber body forming a space in which a substrate is processed, a light emitting part for emitting light to a substrate inside the chamber body, a light entrance portion provided inside the chamber body, through which light from the light emitting part enters and a measuring part for measuring energy of light entering the light entrance portion.

In this apparatus, it is possible to measure energy of light in a chamber, which is emitted to the substrate during thermal processing, by using the light entrance portion.

Since a temperature inside the chamber body becomes high, it is preferable that the apparatus should further comprise a light guide structure for guiding light entering the light entrance portion from the inside of the chamber body to the measuring part disposed outside the chamber body.

According a preferred embodiment of the present invention, the light entrance portion is disposed on a side of a substrate inside the chamber body, the light emitting part comprises a flash lamp, and the measuring part is a calorimeter. It is thereby possible to measure energy given to the substrate in an extremely short time.

Preferably, the apparatus further comprises a calculation part for calculating a surface temperature of a substrate irradiated with light from the light emitting part on the basis of an output of the measuring part, and if the substrate is preliminarily heated, the calculation part calculates a second energy density of light emitted to a center of a substrate from a first energy density of light entering the light entrance portion and calculates a surface temperature of the substrate on the basis of the second energy density and a heating temperature by the heater.

The present invention is also intended for a method of performing a processing accompanied with heating through irradiating a substrate with light.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
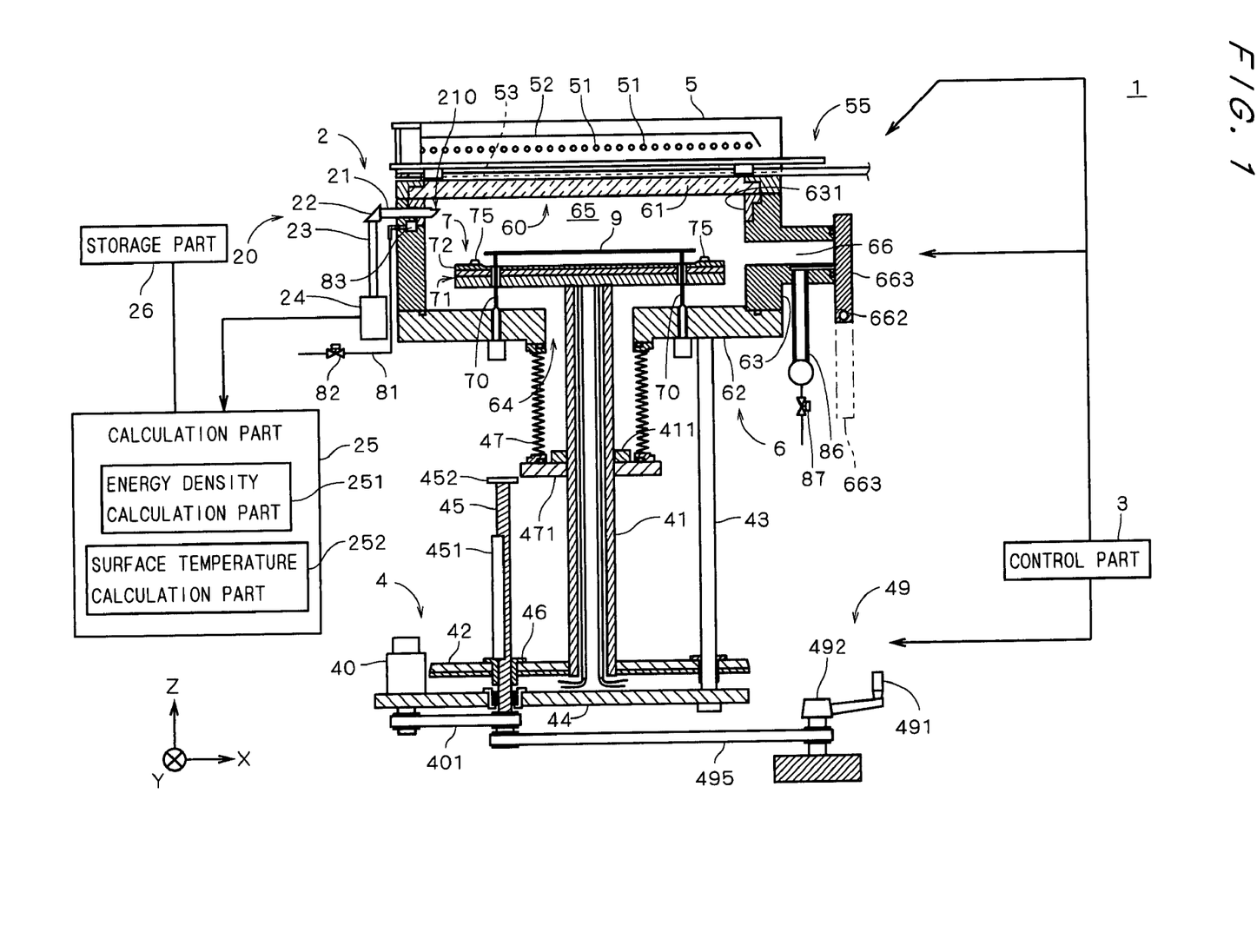
FIG. 1 is a view showing a construction of a thermal processing apparatus in accordance with a first preferred embodiment.

FIG. 1 is a view showing a construction of a thermal processing apparatus 1 in accordance with the first preferred embodiment of the present invention. The thermal processing apparatus 1 is an apparatus for performing a processing accompanied with heating through irradiating a semiconductor substrate 9 (hereinafter, referred to as "substrate 9") with light.

The thermal processing apparatus 1 comprises a chamber side part 63 having a substantially-cylindrical inner wall and a chamber bottom 62 covering a lower portion of the chamber side part 63, which constitute a chamber body 6 forming a space (hereinafter, referred to as "chamber") 65 in which the substrate 9 is processed and comprising an opening (hereinafter, referred to as "upper opening") 60 in its upper portion.

The thermal processing apparatus 1 further comprises a transparent plate 61 which is a closing member attached to the upper opening 60 for closing the upper opening 60, a substantially disk-shaped holding part 7 for holding the substrate 9 inside the chamber body 6 and executing a preliminary heating on the substrate 9, a holding-part moving mechanism 4 for vertically moving the holding part 7 with respect to a bottom of the chamber body, i.e., the chamber bottom 62, a light emitting part 5 for heating the substrate 9 by emitting light through the transparent plate 61 to the substrate 9 held by the holding part 7, a light measuring part 2 for measuring light energy inside the chamber body 6 and a control part 3 for controlling these constituent elements to perform a thermal processing.

The transparent plate 61 is formed of, e.g., quartz or the like and serves as a chamber window for transmitting the light from the light emitting part 5 to the chamber 65. The chamber bottom 62 and the chamber side part 63 are formed of metal material such as stainless steel having excellent strength and heat resistance, and a ring 631 in an upper portion of an inner side surface of the chamber side part 63 is formed of aluminum (Al) alloy or the like having more excellent durability than stainless steel to degradation caused by light irradiation.

On the chamber bottom 62, a plurality of (in the present preferred embodiment, three) support pins 70 stand for supporting the substrate 9 from its lower surface (on the side opposite to a side irradiated with light by the light emitting part 5) through the holding part 7. The support pin 70 is formed of, e.g., quartz, and easy to replace as it is fixed from the outside of the chamber body 6.

The chamber side part 63 has a transfer opening 66 used for loading and unloading of the substrate 9, and the transfer opening 66 is made openable/closable by a gate valve 663 which rotates about an axis 662. On a portion of the chamber side part 63 which is opposite to the transfer opening 66, a gas introduction path 81 is formed to introduce a process gas (e.g., inert gas such as nitrogen (N2) gas, helium (He) gas or argon (Ar) gas, or oxygen (O2) gas) into the chamber 65, whose one end is connected to a not-shown gas supply mechanism through a valve 82 and other end is connected to a gas introduction channel 83 formed inside the chamber side part 63. In the transfer opening 66 formed is a gas exhaust path 86 for exhausting gas in the chamber, which is connected to a not-shown gas exhaust mechanism through a valve 87.

Figure 2:
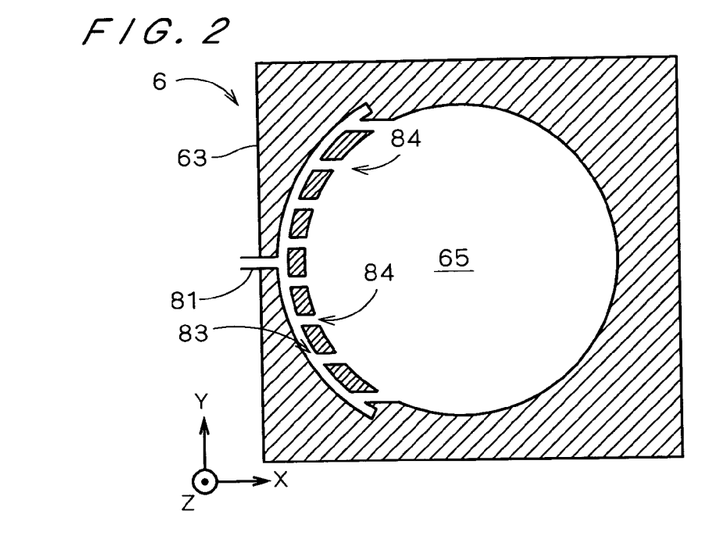
FIG. 2 is a cross section showing a gas path.

FIG. 2 is a cross section of the chamber body 6 taken along a plane perpendicular to the Z direction at a position of the gas introduction channel 83. As shown in FIG. 2, the gas introduction channel 83 is so formed as to cover about one-third of a perimeter of the chamber side part 63 on the side opposite to the transfer opening 66 of FIG. 1, and the process gas introduced by the gas introduction channel 83 through the gas introduction path 81 is supplied to the inside of the chamber 65 from a plurality of gas supply holes 84.

The light measuring part 2 is provided at a portion on a side opposite to the transfer opening 66 of the chamber side part 63, as shown in FIG. 1, and comprises a calorimeter 24 which is a measuring part for measuring energy of light, a light guide structure 20 for guiding the light from the inside of the chamber body 6 to the calorimeter 24 disposed outside the chamber body 6, a calculation part 25 for performing various computations on the basis of an output of the calorimeter 24 and a storage part 26 for storing information required for the various computations performed in the calculation part 25.

The light guide structure 20 comprises a first quartz rod 21 having a diameter of 10 mm, attached to the chamber body 6 over (on the upper (+Z) side of) the gas introduction channel 83, penetrating the chamber side part 63, and a prism formed at a tip of the first quartz rod 21 on a side of the chamber 65 serves as a light entrance portion 210 inside the chamber body 6, through which the light from the light emitting part 5 enters. The light guide structure 20 further comprises a prism 22 adhered to the first quartz rod 21 and a second quartz rod 23 having a diameter of 10 mm, adhered to the prism 22, and the second quartz rod 23 is connected to the calorimeter 24.

Figure 3:
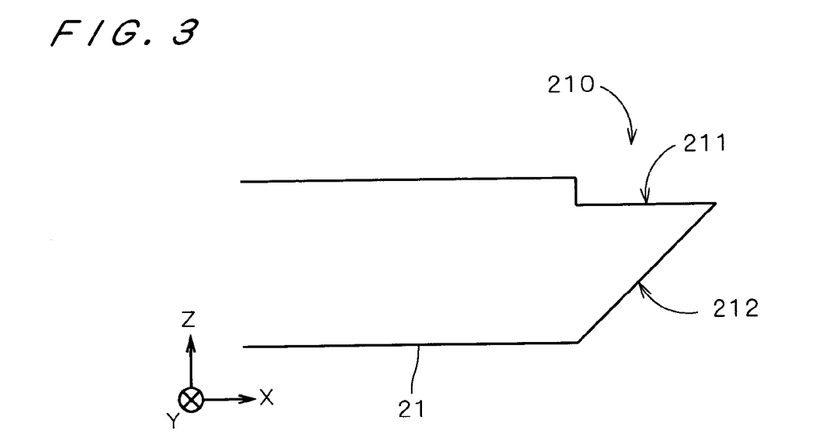
FIGS. 3 to 5 are an elevation, a plan view and a right-side elevation, respectively, showing a tip portion of a first quartz rod on a side of light entrance portion.
Figure 4:
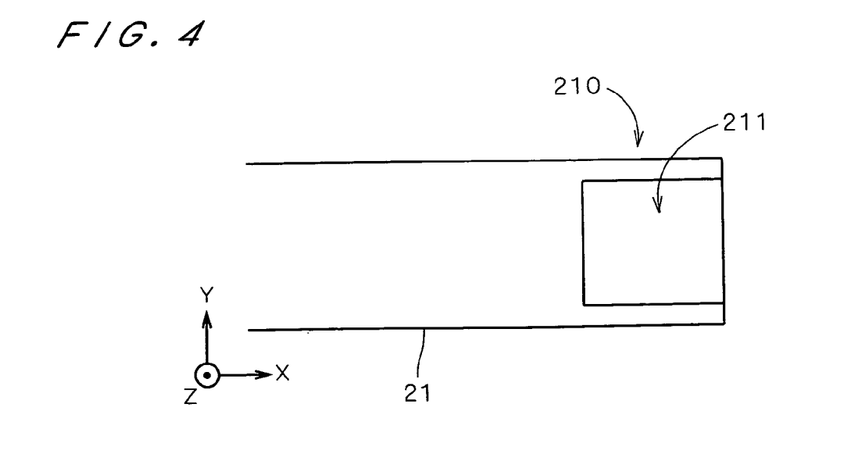
Figure 5:
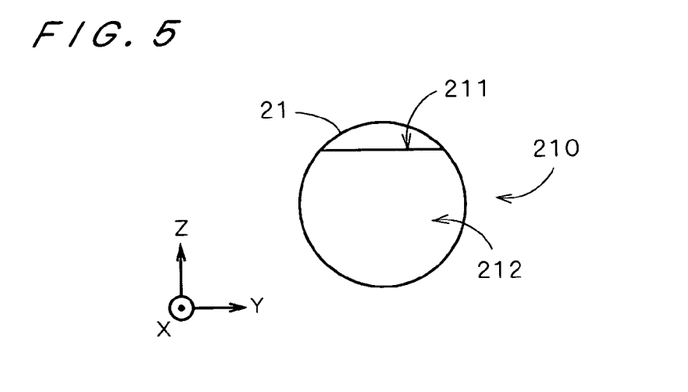

FIGS. 3 to 5 are an elevation as viewed from the (−Y) side, a plan view as viewed from the (+Z) side and a right-side elevation as viewed from the (+X) side, respectively, showing a tip portion of the first quartz rod 21 on a side of chamber 65 (see FIG. 1), i.e., the light entrance portion 210. As shown in FIGS. 3 to 5, the light entrance portion 210 comprises a light entrance surface 211 perpendicular to the Z direction, facing the light emitting part 5 (see FIG. 1) and a reflection surface 212 having an inclination of about 45 degrees with respect to the light entrance surface 211 below (on the lower (−Z) side of) the light entrance surface 211, and is disposed inside the chamber body 6 at a side of the substrate 9 and at the same level as the substrate 9 (in other words, away from the light emitting part 5 at the same distance as the substrate 9) on the holding part 7 positioned at a processing position discussed later (in other words, at a position where the processing accompanied with heating through irradiation of the substrate 9 with light from the light emitting part 5 is performed).

The calorimeter 24 has a black body (not shown) absorbing light, and in the calorimeter 24, the incident light is absorbed by the black body and released as thermal energy and this thermal energy is converted into an electrical signal such as voltage, with which energy of the incident light is measured.

The calculation part 25 comprises an energy density calculation part 251 for calculating an energy density of light emitted to a center portion of the substrate 9 from an energy density of the light entering the light entrance portion 210 from the light emitting part 5 and a surface temperature calculation part 252 for calculating a surface temperature of the center portion of the substrate 9 on the basis of the energy density of the light emitted to the center portion of the substrate 9 and a temperature of preheating by the holding part 7.

The holding-part moving mechanism 4 has a substantially-cylindrical shaft 41, a moving plate 42, guide members 43 (in the present preferred embodiment, three guide members are arranged around the shaft 41), a fixed plate 44, a ball screw 45, a nut 46 and a motor 40. In the chamber bottom 62 which is lower portion of the chamber body 6, an opening (hereinafter, referred to as "lower opening") 64 of substantial circle having a diameter smaller than that of the holding part 7 is formed and the shaft 41 of stainless steel is inserted into the lower opening 64 and connected to a lower surface of the holding part 7 to support the holding part 7.

The nut 46 into which the ball screw 45 is inserted is fixed to the moving plate 42, and the moving plate 42 is made vertically movable, being guided by the guide members 43 which are fixed to the chamber bottom 62, extending downward, and the moving plate 42 is connected to the holding part 7 through the shaft 41.

The motor 40 is disposed on the fixed plate 44 attached to lower end portions of the guide members 43 and connected to the ball screw 45 through a timing belt 401. When the holding part 7 is vertically moved by the holding-part moving mechanism 4, the motor 40 serving as a driving part is controlled by the control part 3 to rotate the ball screw 45, thereby moving the moving plate 42 to which the nut 46 is fixed along the guide members 43. As a result, the shaft 41 is moved along the Z direction of FIG. 1 and the holding part 7 connected to the shaft 41 smoothly moves up and down inside the chamber body 6 during the thermal processing for the substrate 9.

A mecha-stopper 451 of substantial semicylinder (shape of cylinder cut half along a longitudinal direction) stands on an upper surface of the moving plate 42 along the ball screw 45, and even if the moving plate 42 moves up over a predetermined rising limit due to some abnormal conditions, it is possible to prevent abnormal rise of the moving plate 42 as an upper end of the mecha-stopper 451 is pushed against an end plate 452 which is provided at an end portion of the ball screw 45. This prevents the holding part 7 from moving up over a predetermined position below the transparent plate 61 to avoid the collision between the holding part 7 and the transparent plate 61.

The holding-part moving mechanism 4 has a manual moving part 49 for manually moving the holding part 7 up and down during the maintenance for the inside of the chamber body 6. The manual moving part 49 has a handle 491 and a rotation axis 492, and with rotation of the rotation axis 492 through the handle 491, the ball screw 45 connected to the rotation axis 492 through a timing belt 495 is rotated to move the holding part 7 up and down.

The chamber bottom 62 is provided at its lower side with extensible bellows 47 which can so extend downward as to surround the shaft 41, whose upper end is connected to the lower surface of the chamber bottom 62. The other end of the bellows 47 is provided with a bellows lower-end plate 471, which is screwed onto a brim-like member 411 attached to the shaft 41, to thereby keep the inside of the chamber 65 airtight. The bellows 47 is contracted when the holding part 7 is moved up with respect to the chamber bottom 62 by the holding-part moving mechanism 4 and extended when the holding part 7 is moved down.

The holding part 7 has a hot plate 71 used for preheating (assist heating) of the substrate 9 and a susceptor 72 disposed on an upper surface of the hot plate 71 (a surface on the side where the holding part 7 holds the substrate 9), and as discussed above, the shaft 41 used for vertically moving the holding part 7 is connected to the lower surface of the holding part 7 (the hot plate 71). The susceptor 72 is formed of quartz (may be also formed of aluminum nitride (AlN) or the like), and pins 75 are provided on an upper surface of the susceptor 72 to prevent the substrate 9 from deviating from a predetermined position. The susceptor 72 is disposed on the hot plate 71 in surface-to-surface contact between the lower surface of the susceptor 72 and the upper surface of the hot plate 71, so that the susceptor 72 serves to diffuse and conduct thermal energy from the hot plate 71 and can be detached from the hot plate 71 for cleaning during maintenance.

Figure 6:
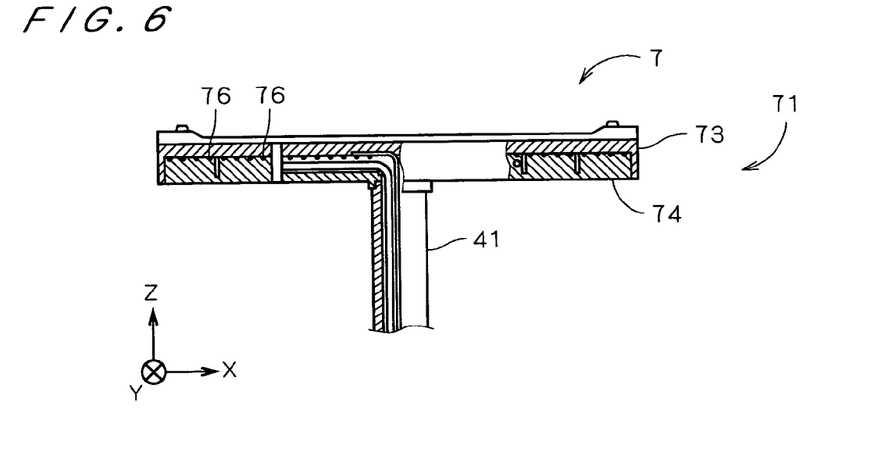
FIG. 6 is a cross section showing a holding part and a shaft.

FIG. 6 is a cross section showing the holding part 7 and the shaft 41. The hot plate 71 has an upper plate 73 and a lower plate 74 both of stainless steel, and resistance heating wires 76 such as nichrome wires for heating the hot plate 71 are provided between the upper plate 73 and the lower plate 74, which are filled with conductive nickel (Ni) brazing filler metals and sealed. End portions of the upper plate 73 and the lower plate 74 are bonded to each other by brazing.

Figure 7:
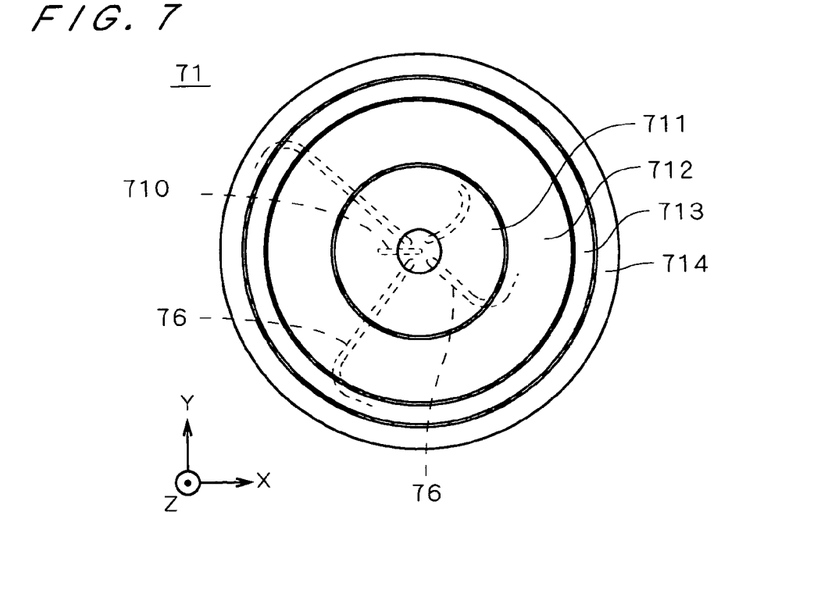
FIG. 7 is a plan view showing a hot plate.

FIG. 7 is a plan view showing the hot plate 71. As shown in FIG. 7, the hot plate 71 is concentrically divided into four zones 711 to 714, and a gap is provided between one zone and the adjacent zone. The zones 711 to 714 are provided with the resistance heating wires 76 which are independent from one another in a rounding manner and heated by these resistance heating wires 76, respectively.

The innermost zone 711 is provided with a sensor 710 for measuring the temperature of the zone 711 with a thermocouple, and the sensor 710 is connected to the control part 3 through the inside of the substantially-cylindrical shaft 41 (see FIG. 6). When the hot plate 71 is heated, the control part 3 controls the amount of power supply for the resistance heating wire 76 provided in the zone 711 so that the temperature of the zone 711 which is measured by the sensor 710 should become a predetermined temperature. The control part 3 controls the temperature of the zone 711 by PID (Proportional, Integral, Differential) control. The amount of power supply for the resistance heating wire 76 provided in each of the zones 712 to 714 is determined on the basis of the amount of power supply for that in the zone 711, according to a predefined correspondence table (correspondence between the amount of power supply for the zone 711 and that required to make the temperatures of the other zones 712 to 714 equal to the temperature of the zone 711). In the hot plate 71, the temperature of the zone 711 is continuously measured until the thermal processing for the substrate 9 (if a plurality of substrates 9 are successively processed, the thermal processing for all the substrates 9) is finished, and with this control, the temperatures of the zones 711 to 714 are kept to be a target temperature.

Figure 8:
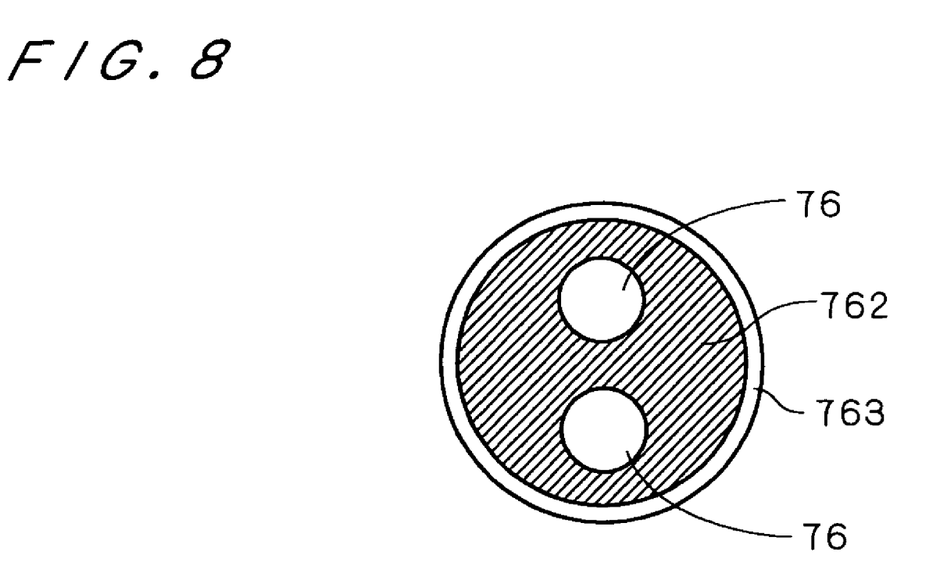
FIG. 8 is a cross section showing resistance heating wires.

The respective resistance heating wires 76 provided in the zones 711 to 714 are connected to a power supply source (not shown) through the inside of the shaft 41, and from the power supply source to the respective zones, two parts of the resistance heating wire 76 from and to the power supply source are so arranged as to be electrically insulated from each other inside a stainless tube 763 filled with an insulative material 762 such as magnesia (magnesium oxide), as shown in FIG. 8. The inside of the shaft 41 is open to the air.

The light emitting part 5 of FIG. 1 has a plurality of (in the present preferred embodiment, thirty) xenon flash lamps (hereinafter, referred to simply as "flash lamps") 51, a reflector 52 and a light diffusion plate 53. A plurality of flash lamps 51 are rod lamps of long cylindrical shape and arranged so that their longitudinal directions (the Y direction of FIG. 1) should be parallel to one another along a main surface of the substrate 9 held by the holding part 7. The reflector 52 is so provided as to entirely cover upper portions of the flash lamps 51 and its surface is roughened by abrasive blasting to have a satin finish. The light diffusion plate 53 is formed of fused quartz whose surface is photodiffused and disposed on a lower surface of the light emitting part 5 with a predetermined gap between itself and the transparent plate 61. The thermal processing apparatus 1 further comprises an emitting-part moving mechanism 55 used for relatively moving the light emitting part 5 towards the (+X) direction with respect to the chamber body 6 during maintenance.

The thermal processing apparatus 1 comprises various constituents for cooling (not shown) so as to prevent excessive increase in temperature of the chamber body 6 and the light emitting part 5 with thermal energy generated from the flash lamps 51 and the hot plate 71 during the thermal processing for the substrate 9. For example, the chamber side part 63 and the chamber bottom 62 in the chamber body 6 are provided with a water-cooling tube, and the light emitting part 5 is provided therein with a supply tube for supplying air and an exhaust tube with silencer to form an air-cooled structure. Compressed air is supplied into the gap between the transparent plate 61 and (the light diffusion plate 53 of) the light emitting part 5, to thereby cool the light emitting part 5 and the transparent plate 61, and organic substances or the like present in the gap are cleared so as not to be deposited onto the light diffusion plate 53 and the transparent plate 61 during the thermal processing.

Figure 9:
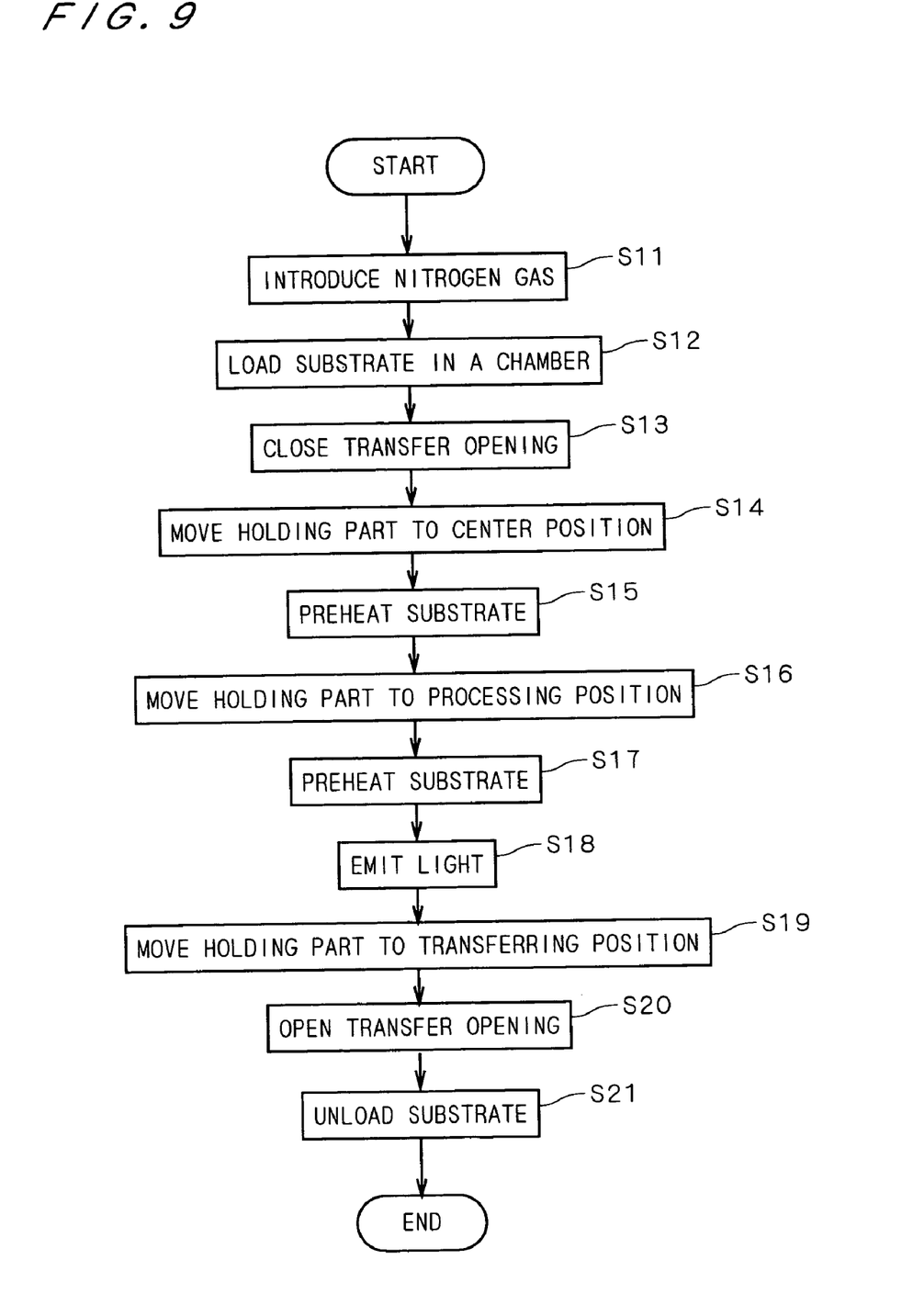
FIG. 9 is a flowchart showing an operation flow of the thermal processing apparatus during a processing operation.

FIG. 9 is a flowchart showing an operation flow of the thermal processing apparatus 1 for performing a thermal processing on the substrate 9. In the present preferred embodiment, the substrate 9 is a semiconductor substrate which is implanted with impurities by ion implantation and the implanted impurities are activated by the thermal processing in the thermal processing apparatus 1. Discussion will be made below on a process for performing a thermal processing on the substrate 9, referring to FIG. 9 and other figures as appropriate, and then discussion will be further made on a process for calculating a surface temperature of the substrate 9 by measuring the light energy inside the chamber body 6, which is performed in parallel with the thermal processing for the substrate 9.

To perform a thermal processing on the substrate 9 in the thermal processing apparatus 1, first, the holding part 7 is arranged near the chamber bottom 62 as shown in FIG. 1. Hereinafter, the position of the holding part 7 in the chamber 65 shown in FIG. 1 is referred to as "transferring position". When the holding part 7 stays at the transferring position, tips of the support pins 70 are positioned above the holding part 7, through the holding part 7. Next, the valves 82 and 87 are opened to introduce room-temperature nitrogen gas into the chamber 65 (Step S11). Subsequently, the transfer opening 66 is opened and the substrate 9 is loaded into the chamber 65 through the transfer opening 66 by a transfer robot (not shown) controlled by the control part 3 (Step S12) and put on a plurality of support pins 70.

Figure 10:
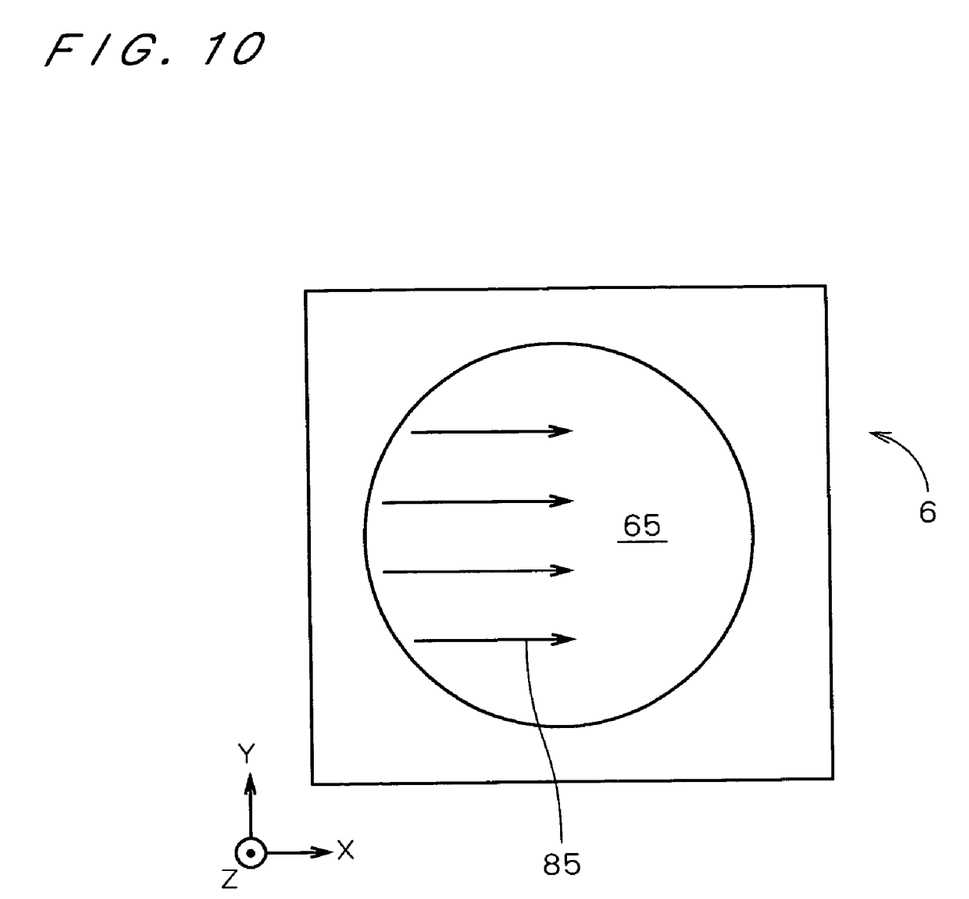
FIG. 10 is a view showing a flow of gas.

FIG. 10 is a view abstractly showing the chamber body 6 of FIG. 2. The amount of nitrogen gas to be purged into the chamber 65 in loading of the substrate 9 is about 40 l/min, and the supplied nitrogen gas flows to a direction indicated by the arrow 85 of FIG. 10 in the chamber 65 and exhausted through the gas exhaust path 86 and the valve 87 of FIG. 1 by utility exhaust. Part of the nitrogen gas supplied to the chamber 65 is exhausted also from an exhaust port (not shown) which is provided at the inner side of the bellows 47. In each of the following steps, the nitrogen gas is continuously supplied to and exhausted from the chamber 65 and the amount of nitrogen gas to be purged is changed in accordance with the process steps for the substrate 9.

When the substrate 9 is loaded into the chamber 65, the gate valve 663 of FIG. 1 closes the transfer opening 66 (Step S13), and the holding-part moving mechanism 4 moves the holding part 7 up to a position near the center (hereinafter, referred to as "center position") along the vertical direction (the Z direction of FIG. 1) of the chamber 65 (Step S14). At this time, the substrate 9 is passed from the support pins 70 to the susceptor 72 of the holding part 7 and held by the susceptor 72. The holding part 7 has been heated up to a predetermined temperature by the resistance heating wires 76 inside the hot plate 71 (between the upper plate 73 and the lower plate 74 of FIG. 6) and preheating of the substrate 9 is performed by bringing the substrate 9 into contact with the holding part 7 (the susceptor 72) (Step S15), to thereby allows gradual increase in temperature of the substrate 9. In the holding part 7, the substrate 9 is uniformly preheated since the thermal energy from the hot plate 71 is diffused by the susceptor 72.

Figure 11:
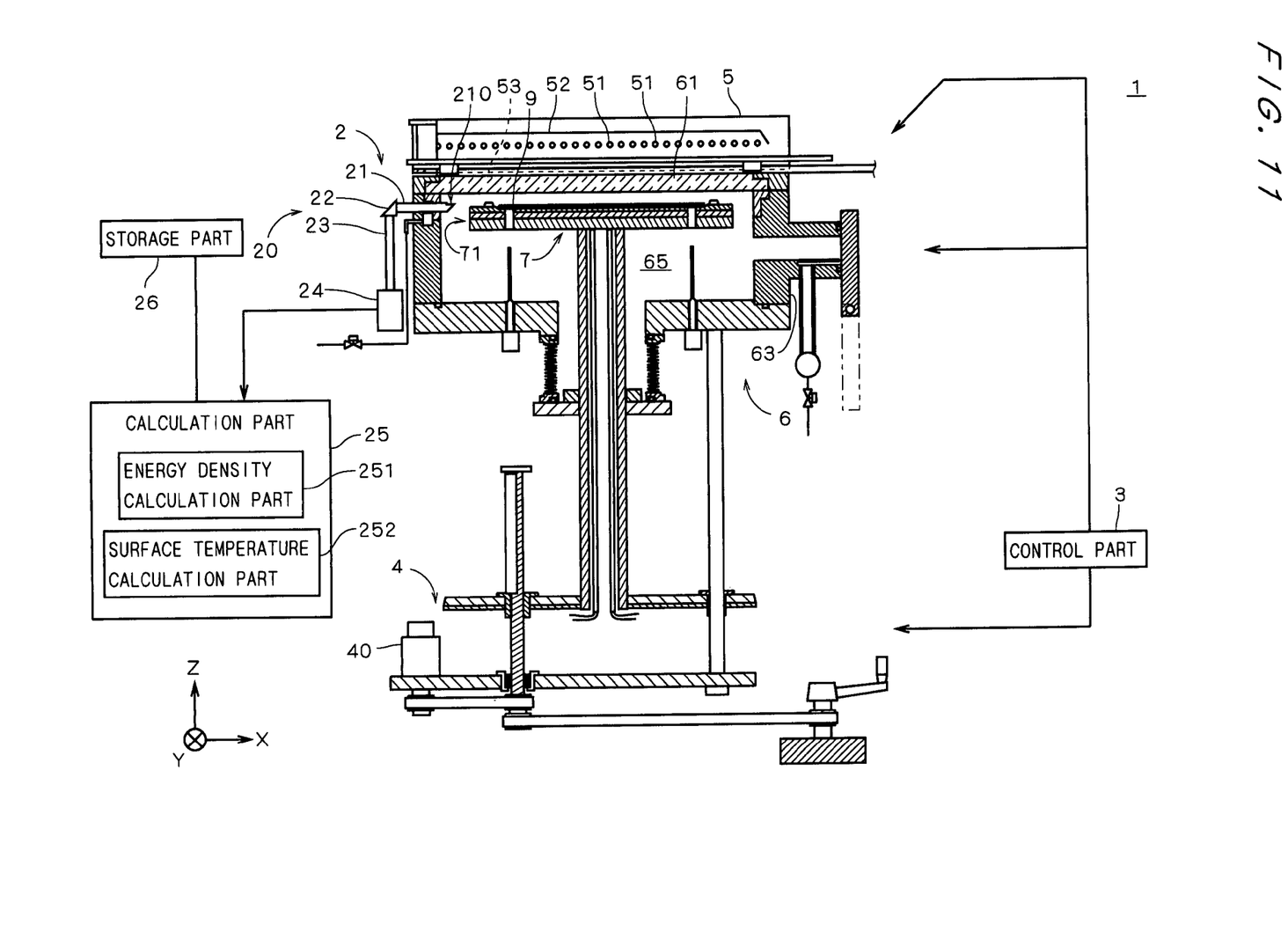
FIG. 11 is a view showing a construction of the thermal processing apparatus.

After the preheating is performed for about one second at the center position, the holding part 7 is moved by the holding-part moving mechanism 4 up to a position near the transparent plate 61 (hereinafter, referred to as "processing position") as shown in FIG. 11 (Step S16) and further preheated for about sixty seconds at this position, and the temperature of the substrate 9 thereby rises up to a predetermined preheating temperature (Step S17). The preheating temperature is in a range from about 200° C. to 600° C. where there is no possibility that the impurities implanted in the substrate 9 should be diffused, preferably from about 350° C. to 550° C. The distance between the holding part 7 and the transparent plate 61 can be arbitrarily controlled by controlling the amount of rotation of the motor 40 in the holding-part moving mechanism 4.

After that, while the holding part 7 stays at the processing position, the control part 3 controls the light emitting part 5 to emit flash light to the substrate 9 (Step S18). At this time, part of the light emitted from the flash lamps 51 of the light emitting part 5 goes through the light diffusion plate 53 and the transparent plate 61 directly towards the inside of the chamber 65 and the other of the light is reflected on the reflector 52, going through the light diffusion plate 53 and the transparent plate 61 to the inside of the chamber 65, which are used to irradiate the substrate 9 to be heated (hereinafter, the heating to raise the surface temperature of the substrate 9 up to the processing temperature is referred to as "main heating" for being distinguished from preheating). Since the main heating is performed by light irradiation, it is possible to increase and decrease the surface temperature of the substrate 9 in a short time.

The light emitted from the light emitting part 5, i.e., the flash lamps 51 is an extremely short and strong flash whose irradiation time ranges from about 0.1 to 10 milliseconds, which is obtained by converting electrostatic energy stored in advance into an extremely short light pulse, and with the light emitted from the flash lamps 51, the surface temperature of the substrate 9 which is mainly heated momentarily rises up to the processing temperature ranging from about 1000° C. to 1100° C. and quickly falls after activation of the impurities implanted in the substrate 9. Thus, in the thermal processing apparatus 1, since the surface temperature of the substrate 9 can increase and decrease in an extremely short time, it is possible to activate the impurities implanted in the substrate 9 while suppressing diffusion of the impurities caused by heating (the diffusion is sometimes referred to as broadening of profile of impurities in the substrate 9).

By preheating of the substrate 9 with the holding part 7 prior to its main heating, it is possible to quickly raise the surface temperature of the substrate 9 with irradiation of light from the flash lamps 51 up to the processing temperature.

After the main heating is finished, the holding part 7 stays waiting for about ten seconds at the processing position and then is moved down to the transferring position shown in FIG. 1 again by the holding-part moving mechanism 4 (Step S19), and the substrate 9 is transferred from the holding part 7 to the support pins 70. Subsequently, the transfer opening 66 which has been closed by the gate valve 663 is opened (Step S20) and the substrate 9 placed on the support pins 70 is unloaded by the transfer robot (Step S21). Thus, a series of operations for thermal processing on the substrate 9 by the thermal processing apparatus 1 is completed.

As discussed above, the nitrogen gas is continuously supplied into the chamber 65 during the thermal processing on the substrate 9 by the thermal processing apparatus 1, and the amount of nitrogen gas to be purged is 30 l/min when the holding part 7 stays at the processing position (in other words, during a period from the time when the holding part 7 is moved to the processing position after the preheating for about one second at the center position to the time when the waiting for about ten seconds after light irradiation is finished) and 40 l/min when the holding part 7 stays at any position other than the processing position.

In the thermal processing apparatus 1, when the same thermal processing is performed on a new substrate 9, such operations as loading of the substrate 9 into the chamber 65, light irradiation and unloading of the substrate 9 from the chamber 65 (Steps S12 to S21) are repeated. When a different thermal processing is performed on a new substrate 9, the holding part 7 moves up to the processing position and stays waiting there while various settings are made in accordance with the new thermal processing (such as setting of the amount of nitrogen gas to be purged). By keeping the temperature of the transparent plate 61 to be almost equal to a temperature at the time when the thermal processings are continuously performed, it is possible to keep the quality of processing on the substrate 9 in the new thermal processing.

Figure 12:
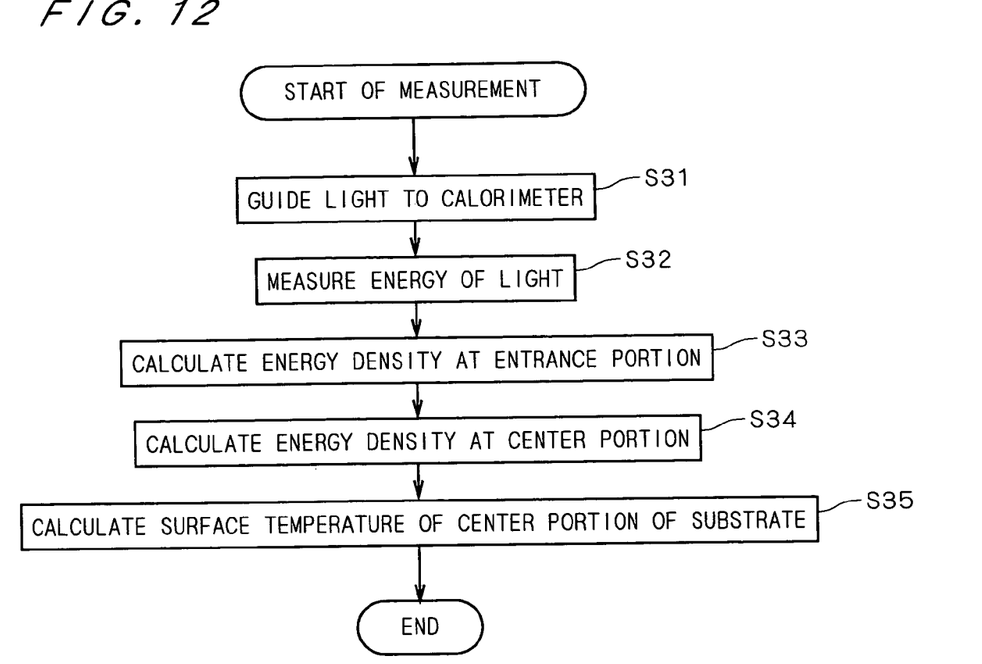
FIG. 12 is a flowchart showing an operation flow of a light measuring part for calculating a surface temperature of a substrate.

Next, discussion will be made on a process of calculating a surface temperature of the substrate 9 by measuring the energy of light inside the chamber body 6, which is performed in parallel with the thermal processing for the substrate 9, along the operation flow of the light measuring part 2 shown in FIG. 12.

In the thermal processing apparatus 1, as discussed above, after the operations of S11 to S17 shown in FIG. 9 are performed, light is emitted from the light emitting part 5 to the substrate 9 on the holding part 7 positioned at the processing position of FIG. 11 (Step S18). At this time, the light from the light emitting part 5 goes towards the inside of the chamber 65 to be used for main heating for the substrate 9 and enters the light entrance surface 211 of the light entrance portion 210 (see FIG. 3).

The light entering the light entrance portion 210 is reflected on the reflection surface 212 (see FIG. 3) towards the (−X) direction to be guided to the outside of the chamber body 6 by the first quartz rod 21 of the light guide structure 20, and further reflected on the prism 22 towards the (−Z) direction to be guided to the calorimeter 24 by the second quartz rod 23 (Step S31).

The light received by the calorimeter 24 is absorbed by the black body inside the calorimeter 24 and converted into an electrical signal to be measured (Step S32). The measured energy of light is transmitted to the calculation part 25 and divided by an area of the light entrance surface 211 and multiplied by a predetermined correction factor to obtain an energy density of light entering the light entrance portion 210 (hereinafter, referred to as "energy density at entrance portion") in the calculation part 25 (Step S33).

Figure 13:
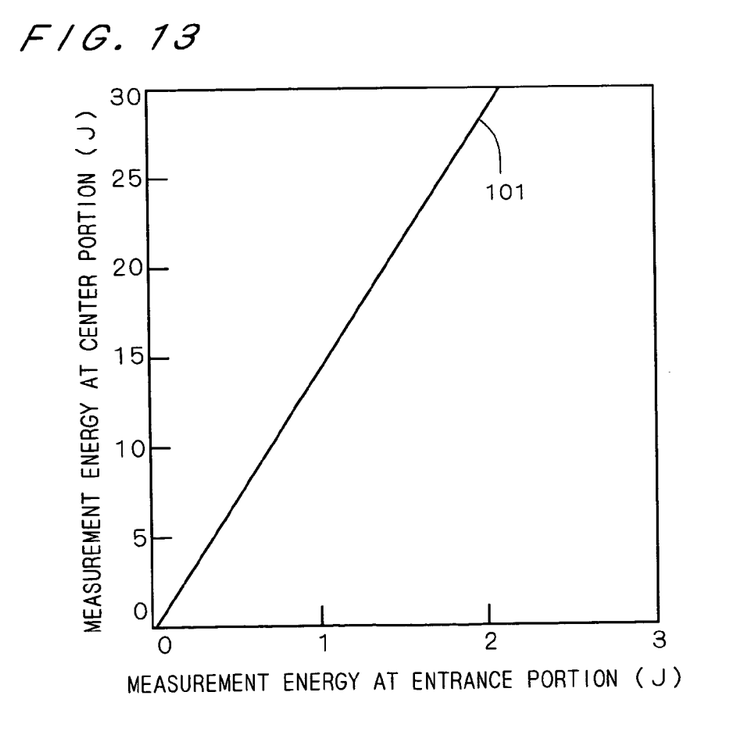
FIG. 13 is a graph showing a relation between a measurement energy at entrance portion and a measurement energy at center portion.

FIG. 13 is a graph showing a relation between light energy (J) measured by the light measuring part 2 in a measurement operation separately performed in advance (hereinafter, referred to as "measurement energy at entrance portion") and light energy (J) measured at a position which corresponds to the center portion of the substrate 9 at the processing position (hereinafter, referred to as "measurement energy at center portion"). In the measurement operation, in the thermal processing apparatus 1, an auxiliary calorimeter of the same type as the calorimeter 24 is temporarily provided at a position which corresponds to the center portion of the substrate 9 at the processing position (at this time, the holding part 7 is detached from the chamber body 6 and will be attached again after the measurement), the light from the light emitting part 5 is emitted to the substrate 9 to measure the energy of light by the calorimeter 24 and the auxiliary calorimeter, and the relation between the measurement energy at entrance portion and the measurement energy at center portion is stored in the storage part 26.

As indicated by the straight line 101 of FIG. 13, since the measurement energy at entrance portion and the measurement energy at center portion are almost in a proportional relation, by measuring the energy of light entering the light entrance portion 210, it is possible to easily obtain the energy of light emitted to the center portion of the substrate 9 at the processing position. In the thermal processing apparatus 1, from the energy density at entrance portion obtained in Step S33 and the data representing the straight line 101, which is stored in the storage part 26, the energy density of light emitted to the center portion of the substrate 9 (hereinafter, referred to as "energy density at center portion") can be obtained by the energy density calculation part 251 of the calculation part 25 (Step S34).

In the light measuring part 2 of FIG. 11, the light entrance surface 211 (see FIG. 3) is disposed at the same level as the main surface of the substrate 9 at the processing position as discussed earlier. Specifically, the light entrance portion 210 is disposed so that the distance from the light emitting part 5 to the light entrance surface 211 (the distance in the vertical (Z) direction in this preferred embodiment) and that from the light emitting part 5 to the main surface of the substrate 9 on the side where the light is emitted should be equal between a side surface of the holding part 7 and the chamber side part 63. With this arrangement, the respective degrees of diffuse reflection light out of the energy of light emitted from the light emitting part 5 which affect the light entrance portion 210 and the substrate 9 almost become equal. The shape of the reflector 52 and the arrangement of the flash lamps 51 are adjusted so that the illumination distribution should become uniform at the processing position, and such a structure of the light emitting part 5 contributes to the precision of the energy density at center portion.

Figure 14:
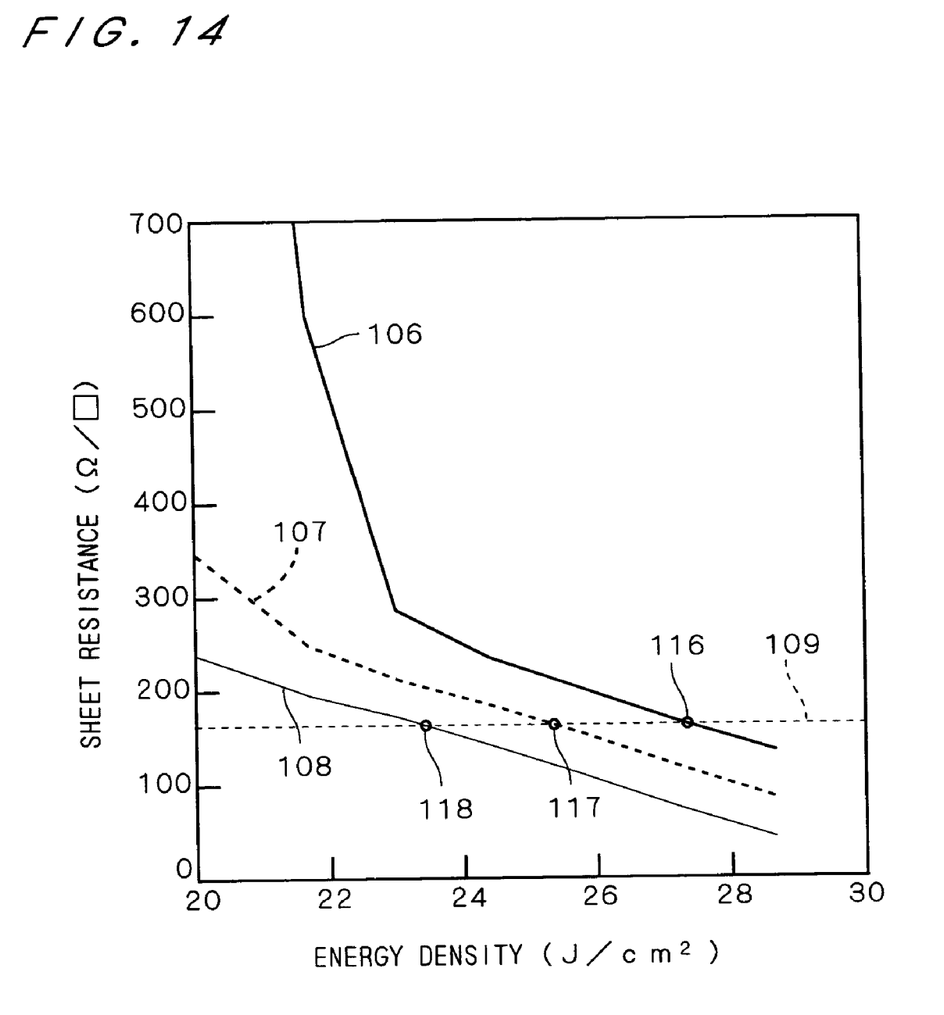
FIG. 14 is a graph showing a relation between energy density of light emitted to the substrate and sheet resistance of the substrate.

FIG. 14 is a graph showing a relation between the energy density of light ($J/cm^2$) emitted to the substrate 9 from the light emitting part 5 and sheet resistance ($\Omega/\square$) of the surface of the substrate 9 after light irradiation, which is obtained in advance through an experiment. The solid line 106 of FIG. 14 indicates a relation between the energy density and the sheet resistance in a case where the substrate 9 is preheated by the holding part 7 up to 400° C. before light irradiation, and the broken line 107 and the fine solid line 108 of FIG. 14 indicate respective relations between the energy density and the sheet resistance in cases where the substrate 9 is preheated up to 450° C. and 500° C. The relations indicated by the lines 106 to 108 are obtained by irradiating the substrate 9 with light of various energy densities and measuring the sheet resistance of its surface (measuring the sheet resistance in a range of 10 nm to 15 nm from the surface of the substrate 9) after preheating the substrate 9 up to the respective preheating temperatures (400° C., 450° C. and 500° C.). The lines 106 to 108 of FIG. 14 are obtained with respect to a bare substrate.

Since the obtained sheet resistances are equal if the surface temperatures of the substrates 9 during heating are equal, paying attention to the line 109 of FIG. 14 indicating a constant sheet resistance, respective surface temperatures of the substrate 9 at intersection points 116 to 118 between the line 109 and the lines 106 to 108 are equal. As shown in FIG. 14, in a range where the energy density is not lower than 23 J/cm$^2$, the lines 106 to 108 are linear and almost in parallel with one another and the distance between the intersection points 116 and 117 and that between the intersection points 117 and 118 are almost equal, being about 1.89 J/cm$^2$. Therefore, to heat the substrate 9 up to a predetermined temperature through light irradiation, if the preheating temperature is lower by 50° C., the energy density of emitted light has only to be made higher by about 1.89 J/cm$^2$. From the above, assuming that the preheating temperature of the substrate 9 is Ta (° C.) and the energy density of light emitted to the center portion of the substrate 9 is Ec (j/cm$^2$), the surface temperature Tc (° C.) at the center portion of the substrate 9 during light irradiation can be expressed as follows:

$$Tc=Ta+26.5Ec \quad \text{(Eq. 1)}$$

In the thermal processing apparatus 1, the relation of Eq. 1 is stored in the storage part 26 in advance, and the surface temperature of the center portion of the substrate 9 is obtained by the surface temperature calculation part 252 from the energy density of light emitted to the center portion of the substrate 9 obtained by the energy density calculation part 251 and the temperature of the substrate 9 preheated by the holding part 7 (Step S35). In the thermal processing apparatus 1, it is recognized that the surface of the substrate 9 is melted when the substrate 9 is irradiated with light from the flash lamps 51 whose output is set so that the surface temperature of the substrate 9 to be calculated should be equal to a melting temperature of the substrate 9. A substrate to be processed may be a substrate on which patterns are formed, and the relations of FIG. 14 and Eq. 1 are obtained in advance and stored in the storage part 26 for each type of substrate to be processed.

Thus, in the light measuring part 2, the center portion energy density of the substrate 9 is obtained on the basis of the output of the calorimeter 24 and the surface temperature of the center portion of the substrate 9 irradiated with light from the light emitting part 5 is obtained by the calculation part 25.

As the structure and operation of the thermal processing apparatus 1 has been discussed above, in the thermal processing apparatus 1, the energy of light emitted from the light emitting part 5 during the thermal processing inside the chamber body 6 can be measured by the light measuring part 2 and the surface temperature of the center portion of the substrate 9 can be obtained on the basis of the measurement result. Especially, even if the substrate 9 is preliminarily heated by the holding part 7, it is possible to obtain the surface temperature of the center portion of the substrate 9 with accuracy. Then, by monitoring the light energy and the surface temperature of the substrate 9, it is possible to detect a fall in surface temperature of the substrate 9 (in other words, reduction in energy of light from the light emitting part 5 inside the chamber body 6) due to deterioration and/or failure of the flash lamps 51, the stains and dirt of the transparent plate 61 and the like to avoid any processing failure and further possible to achieve improvement in yield, leading to reduction in manufacturing cost.

In the light measuring part 2, since the calorimeter 24 is used as a measuring part for measuring light energy, it is possible to measure the light energy with accuracy even if the irradiation time is extremely short and the light is emitted from the flash lamps 51 having high energy density. Since the calorimeter 24 is disposed outside the chamber body 6 because of presence of the light guide structure 20, it is possible to perform a stable measurement of the light energy inside chamber body 6 with no effect of circumstances inside the chamber 65 (circumstances depending on processing types, such as high temperature, high-density electromagnetic wave or the like).

In the light guide structure 20, it is possible to guide the light inside the chamber body 6 to the outside with inexpensive and simple structure, i.e., by using the first quartz rod 21 provided with the light entrance portion 210 at its tip. By using the first quartz rod 21 and the second quartz rod 23, it is possible to utilize total reflection of the light entering the light entrance portion 210 to suppress attenuation for surely guiding the light to the outside of the chamber body 6. Since the light entrance portion 210 is disposed on a side of the substrate 9 at the processing position, it is possible to obtain the energy of light emitted to the substrate 9 with accuracy.

In the thermal processing apparatus 1, since the substrate 9 is heated by irradiation of light emitted from the light emitting part 5 to allow the surface temperature of the substrate 9 to rise and fall in a short time, it is possible to achieve a processing which is hard to execute through a long heating, such as thinning of an insulating film such as an oxide film. The thermal processing apparatus 1 uses the flash lamps 51 as a light source, which allows the surface temperature of the substrate 9 to rise and fall in an extremely short time, and it is therefore possible to achieve a processing which requires heating for a still shorter time, such as suppressing of rediffusion of impurities in activation of impurities implanted by ion implantation.

Figure 15:
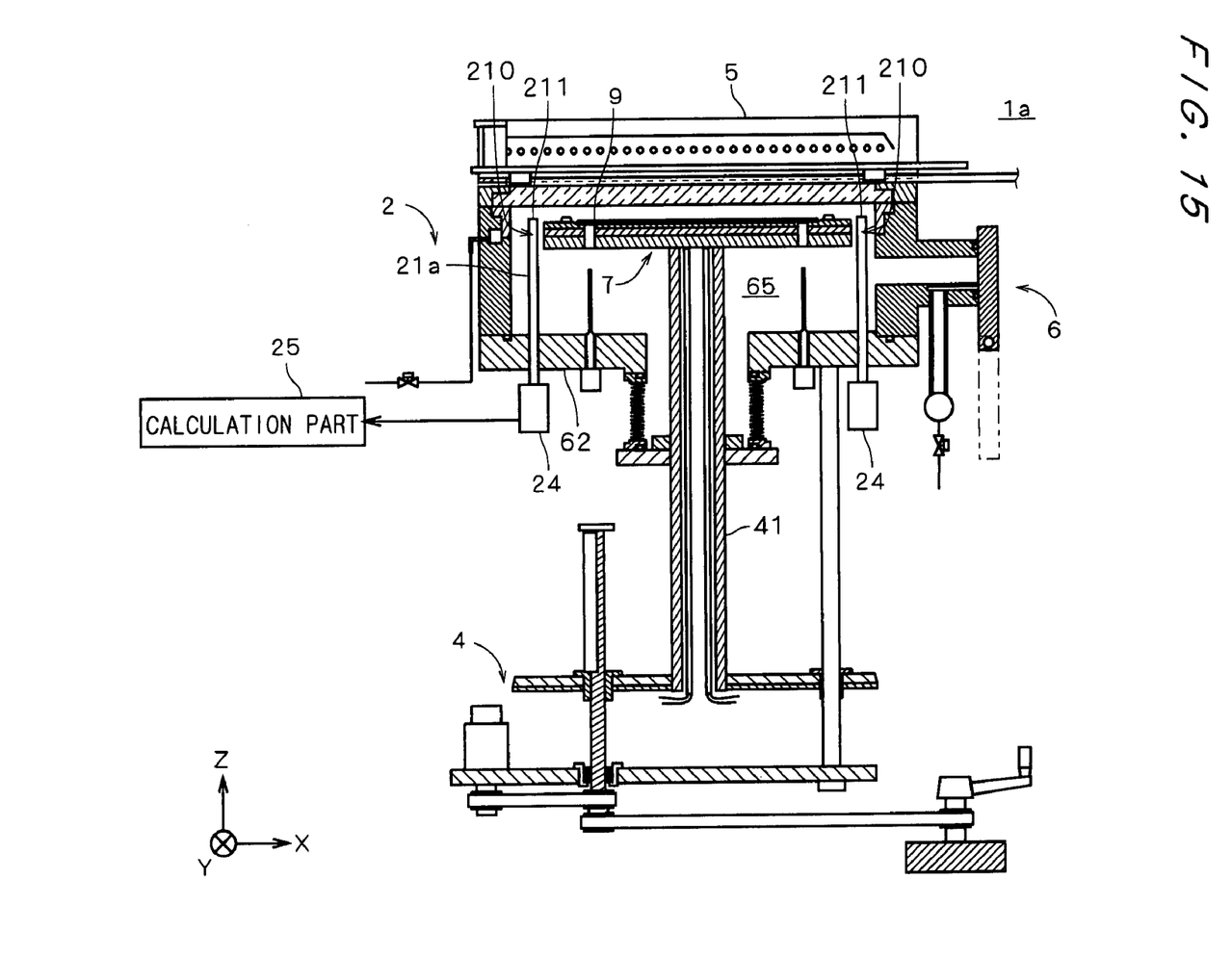
FIG. 15 is a view showing a construction of a thermal processing apparatus in accordance with a second preferred embodiment.

FIG. 15 is a view showing a construction of a thermal processing apparatus 1a in accordance with the second preferred embodiment of the present invention, and the thermal processing apparatus 1a is the same as the thermal processing apparatus 1 of the first preferred embodiment except for part of the light measuring part 2. In FIG. 15, almost the same reference signs are given as used in the first preferred embodiment.

The light measuring part 2 of the thermal processing apparatus 1a is provided with a plurality of calorimeters 24 below the chamber body 6, and a quartz rod 21a penetrating the chamber bottom 62 and extending towards the light emitting part 5 is connected to each calorimeter 24. A tip portion of the quartz rod 21a serves as the light entrance portion 210 having a horizontal tip surface as the light entrance surface 211. In other words, in the thermal processing apparatus 1a, the quartz rod 21a itself serves as the light guide structure of the first preferred embodiment. FIG. 15 shows a state where the holding part 7 is positioned at the processing position, and the light entrance surface 211 is positioned at the same level as the substrate 9 held by the holding part 7.

In the thermal processing apparatus 1a, a plurality of combinations of the quartz rods 21a serving as the light guide structure and the calorimeters 24 are arranged symmetrically with respect to the shaft 41. In other words, a plurality of light entrance portions 210 are arranged around the holding part 7. Respective outputs from the calorimeters 24 are inputted to the calculation part 25. A basic operation of the thermal processing apparatus 1a is shown FIG. 9 and the operation for calculating the surface temperature of the substrate 9 is different from that of the first preferred embodiment only in that the energy densities of lights entering the light entrance portions 210 are obtained in Step S33 of FIG. 12 and then the average value of these measurement values is used to calculate the energy density at center portion and the surface temperature of the substrate 9 in Steps S34 and S35.

Thus, in the thermal processing apparatus 1a, since the calorimeters 24 are arranged below the chamber body 6, it is possible to provide the calorimeters 24 without increasing a footprint of the apparatus. By providing a plurality of combinations of the light guide structures and calorimeters 24, it is possible to perform a more reliable measurement. In the first preferred embodiment, a plurality of combinations of light guide structures 20 and the calorimeters 24 may be provided, and conversely, if it is not necessary to provide a plurality of combinations in the second preferred embodiment, only one combination of quartz rod 21a and calorimeter 24 may be provided.

Though the preferred embodiments of the present invention have been discussed above, the present invention is not limited to the above-discussed preferred embodiments, but allows various variations.

For example, in the light emitting part 5, the number of flash lamps 51 and layout and shapes of them are not limited to those shown in the preferred embodiments but may be appropriately changed in accordance with conditions such as the size of the substrate 9 to be thermally processed. Krypton flash lamps may be used instead of the xenon flash lamps, and light sources other than the flash lamps, such as halogen lamps, may be also used.

Like a case where halogen lamps are used as a light source for emitting light to the substrate 9, if the thermal processing of the substrate 9 is performed in a relatively longer time as compared with a case of using the flash lamps 51, in order to make the whole result of the thermal processing on all the substrates 9 uniform, a structure may be adopted in which the holding part 7 is rotated about the shaft 41 in the chamber 65. In this case, other photosensors may be provided as a measuring part of the light measuring part 2 instead of the calorimeter 24.

Though it is preferable that the structure including the holding part 7 and the shaft 41 used for holding and vertically moving the holding part 7 should be a T-shaped structure in terms of reduction in capacity of the closed space around the substrate 9, the structure is not limited to the T-shaped one.

The light entrance portion 210 may be another prism or mirror independent from the first quartz rod 21. Though it is preferable that the light entrance portion 210 should be formed of a material having the property of cutting infrared rays in consideration of the property of the semiconductor substrate 9 not absorbing infrared rays, if little spectral distribution of light emitted from the light emitting part 5 is present in an infrared region, the property regarding infrared rays is not important so much. The first quartz rod 21 may be formed of glass other than quartz. The light guide structure 20 may not be necessarily constituted of the quartz rod and the prism only if the light guide structure 20 can suppress attenuation of light entering the light entrance portion 210 and surely guide the light to the calorimeter 24, and an optical fiber, for example, may be used and the light may be guided to the outside of the chamber 65 by a mirror or the like without using any light guide member.

The light entrance surface 211 of the light entrance portion 210 may not be necessarily made at the same level to the main surface of the substrate 9 at the processing position but the light entrance portion 210 may be disposed at an arbitrary position where it does not become an obstacle to the thermal processing for the substrate 9 inside the chamber body 6 only if a correlation between the energy density of light entering the light entrance portion 210 and the energy density of light at the center portion of the substrate 9 can be obtained in advance with accuracy.

If a relative low-temperature processing for a substrate, for example, a processing for a glass substrate for such as an LCD, a reticle or the like is performed, the calorimeter 24 may be disposed inside the chamber body 6. In this case, the light guide structure 20 is omitted. When the calorimeter 24 is disposed inside the chamber body 6, it is preferable that the calorimeter 24 should be isolated from the closed space in which the substrate 9 is processed.

In the thermal processing apparatus 1, there may be a case where the output of the calorimeter 24 (the energy of light entering the light entrance portion 210) during a normal operation of the apparatus is stored in the storage part 26 in advance as a reference value and the output of the calorimeter 24, instead of the surface temperature of the center portion of the substrate 9, is compared with the reference value, to detect reduction in energy of light from the light emitting part 5 inside the chamber body 6 due to deterioration and/or failure of the flash lamps 51, the stains and dirt of the transparent plate 61 and the like.

In the thermal processing apparatus 1, other than activation of impurities for the substrate 9, processings accompanied with various heating operations, such as oxidation, anneal or CVD, may be performed on a semiconductor substrate or a glass substrate used for a flat panel display such as a liquid crystal display or a plasma display, and the preheating may be omitted as appropriate.

While the invention has been shown and described in detail, the foregoing description is in all aspects illustrative and not restrictive. It is therefore understood that numerous modifications and variations can be devised without departing from the scope of the invention.

What is claimed is:

1. An apparatus for heating a substrate by irradiating said substrate with light, comprising:
   a chamber body forming a space in which a substrate is processed, said chamber body comprising an opening;
   a light emitting part for emitting light through a transparent plate to a substrate inside said chamber body, said transparent plate closing said opening, said light emitting part comprising a flash lamp;
   a light entrance portion provided inside said chamber body, wherein light emitted from said light emitting part enters said light entrance portion through said transparent plate;
   a measuring part for measuring energy of light entering said light entrance portion,
   a calculation part for calculating a surface temperature of a substrate irradiated with light from said light emitting part on the basis of an output of said measuring part, and
   a heater for preliminarily heating a substrate inside said chamber body; wherein a substrate is heated by irradiating said substrate with flash light emitted from said flash lamp, and energy of said flash light during the entire heating is measured by said measuring part; and said calculation part calculates a second energy density of light emitted to a center of a substrate from a first energy density of light entering said light entrance portion and calculates a surface temperature of said substrate on the basis of said second energy density and a heating temperature by said heater.

2. A method of heating a substrate by irradiating said substrate with light, comprising:

a preheating step of preliminarily heating said substrate disposed inside a chamber body forming a space in which said substrate is processed;

a light emission step of emitting flash light from a light emitting part through a transparent plate to a said substrate disposed inside said chamber body to heat said substrate, said chamber body comprising an opening, said transparent plate closing said opening;

a measurement step of measuring energy of said flash light during the entire heating in said light emission step, wherein said flash light enters a light entrance portion through said transparent plate, said light entrance portion being provided inside said chamber body; and a calculation step of calculating a surface temperature of said substrate on the basis of a measurement value in said measurement step;

wherein said calculation step comprises the steps of:

calculating a second energy density of light emitted to a center of said substrate from a first energy density of light entering said light entrance portion; and calculating a surface temperature of said substrate on the basis of said second energy density and a heating temperature in said preheating step.

3. The method according to claim 2, wherein energy of light entering a plurality of light entrance portions from said light emitting part inside said chamber body is measured in said measurement step, and a surface temperature of said substrate is calculated in said calculation step on the basis of a plurality of measurement values obtained in said measurement step.

* * * * *